United States Patent
Manglore

(10) Patent No.: US 6,201,415 B1
(45) Date of Patent: Mar. 13, 2001

(54) LATCHED TIME BORROWING DOMINO CIRCUIT

(75) Inventor: Rajesh Manglore, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/369,079

(22) Filed: Aug. 5, 1999

(51) Int. Cl.[7] .............................................. H03K 19/096
(52) U.S. Cl. .............................. 326/98; 326/121; 326/93
(58) Field of Search .............................. 326/93–98, 112, 326/119, 121; 327/407, 408

(56) References Cited

U.S. PATENT DOCUMENTS

| | | | |
|---|---|---|---|
| 5,453,708 | 9/1995 | Gupta et al. | 326/98 |
| 5,661,675 | 8/1997 | Chin et al. | 364/768 |
| 5,671,151 | 9/1997 | Williams | 364/489 |
| 5,796,282 | 8/1998 | Sprague et al. | 327/210 |
| 5,825,208 | 10/1998 | Levy et al. | 326/98 |
| 5,831,990 * | 11/1998 | Queen et al. | 371/22.1 |
| 5,892,372 | 4/1999 | Ciraula et al. | 326/96 |
| 5,896,046 | 4/1999 | Bjorksten et al. | 326/98 |
| 6,049,231 * | 4/2000 | Bosshart | 326/98 |
| 6,087,855 * | 7/2000 | Frederick, Jr. et al. | 326/98 |
| 6,108,805 * | 8/2000 | Rajsuman | 326/95 |

OTHER PUBLICATIONS

Bryant, R.E., "Graph–Based Algorithms for Boolean Function Manipulation", *IEEE Transactions on Computers*, C–35 (8), 677–691, (1986).

Chakradhar, S.T., et al., "An Exact Algorithm for Selecting Partial Scan Flip–Flops", Proceedings, 31st Design Automation Conference, San Diego, California, 81–86, (1994).

Chakravarty, S., "On the Complexity of Using BDDs for the Synthesis and Analysis of Boolean Circuits", 27th Annual Allerton Conference on Communication, Control, and Computing, Allerton House, Monticello, Illinois, 730–739, (1989).

Patra, P., et al., "Automated Phase Assignment for the Synthesis of Low Power Domino Circuits", Proceedings of the 36th ACM/IEEE Conference on Design Automation, 379–384, (1999).

Puri, et al., "Logic Optimization by Output Phase Assignment in Dynamic Logic Synthesis", International Conference on Computer Aided Design, (1996).

Thompson, S., et al., "Dual Threshold Voltages and Substrate Bias: Keys to High Performance, Low Power, 0.1 um Logic Designs", 1997 Symposium on VLSI Technology Digest of Technical Papers, 69–70, (1997).

* cited by examiner

*Primary Examiner*—Michael Tokar
*Assistant Examiner*—Don Phu Le
(74) *Attorney, Agent, or Firm*—Schwegman, Lundberg, Woessner & Kluth, P.A.

(57) ABSTRACT

A time borrowing domino circuit that includes complementary logic outputs and a multiplexor without incurring the time delays normally associated with complementary outputs and multiplexor function is described. A clock delay circuit is described which produces the trailing edge delay clock signal that drives the domino circuit. A domino circuit is described that may implement logical functions such as AND, OR, NAND, NOR, EXCLUSIVE-OR and EXCLUSIVE-NOR. A multiplexor circuit is described for gating one of a number of logical inputs to a latch. And a latch is described having complementary outputs.

22 Claims, 5 Drawing Sheets

LATCHED TIME BORROWING DOMINO CIRCUIT

FIELD

This invention relates to the field of semiconductor logic devices, and more particularly to the clocking of data in domino circuits.

BACKGROUND

In the field of semiconductor devices, the frequency of operation of the devices is constantly increasing. For clocked logic devices, the time to evaluate, which is the time allotted for a logic input to propagate to a logic output, is constantly decreasing and this increases the opportunity for corruption of the data outputs of these devices. For domino circuits this problem is especially acute, since the time to evaluate is one-half of the clock period.

In domino circuits, data is received on a first transition of the clock, evaluated, and latched on the next transition of the clock. Such paths are difficult to design, since time cannot be borrowed from the previous cycle as in the case of static circuits, and, as mentioned above, the time to evaluate is one-half of the clock period.

Since the time to evaluate in a domino circuit is one-half of a clock period, the speed of a domino circuit can limit the clock frequency of the system. For example, if the output signal of a domino circuit misses the setup time to a latch by t nanoseconds and the clock period is T, then the frequency of the chip is reduced to 1/(T−2t). In contrast, for a path which does not have domino circuits, not meeting the setup time by an equal amount will reduce the frequency to 1(T−t), or only one-half the amount as for domino circuits.

Time borrowing domino circuits are known in the art, but they have several disadvantages. First, to obtain a complementary output of a domino circuit, an extra inverter and its accompanying delay is required. Second, when following a domino circuit with a multiplexor, a multiplexor delay is encountered. Each of these delays tends to slow the operation of the domino circuits and to increase the likelihood of data corruption as the frequency of operation is increased.

For these and other reasons there is a need for the present invention.

SUMMARY

For one embodiment of the present invention, an integrated circuit comprises a latched time borrowing domino circuit having a first input receive a clock signal and a second input receive a logic signal. The latched time borrowing domino circuit is coupled to a circuit and provides a multiplexor function and complementary logic outputs without adding a logic gate delay.

DETAILED DESCRIPTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
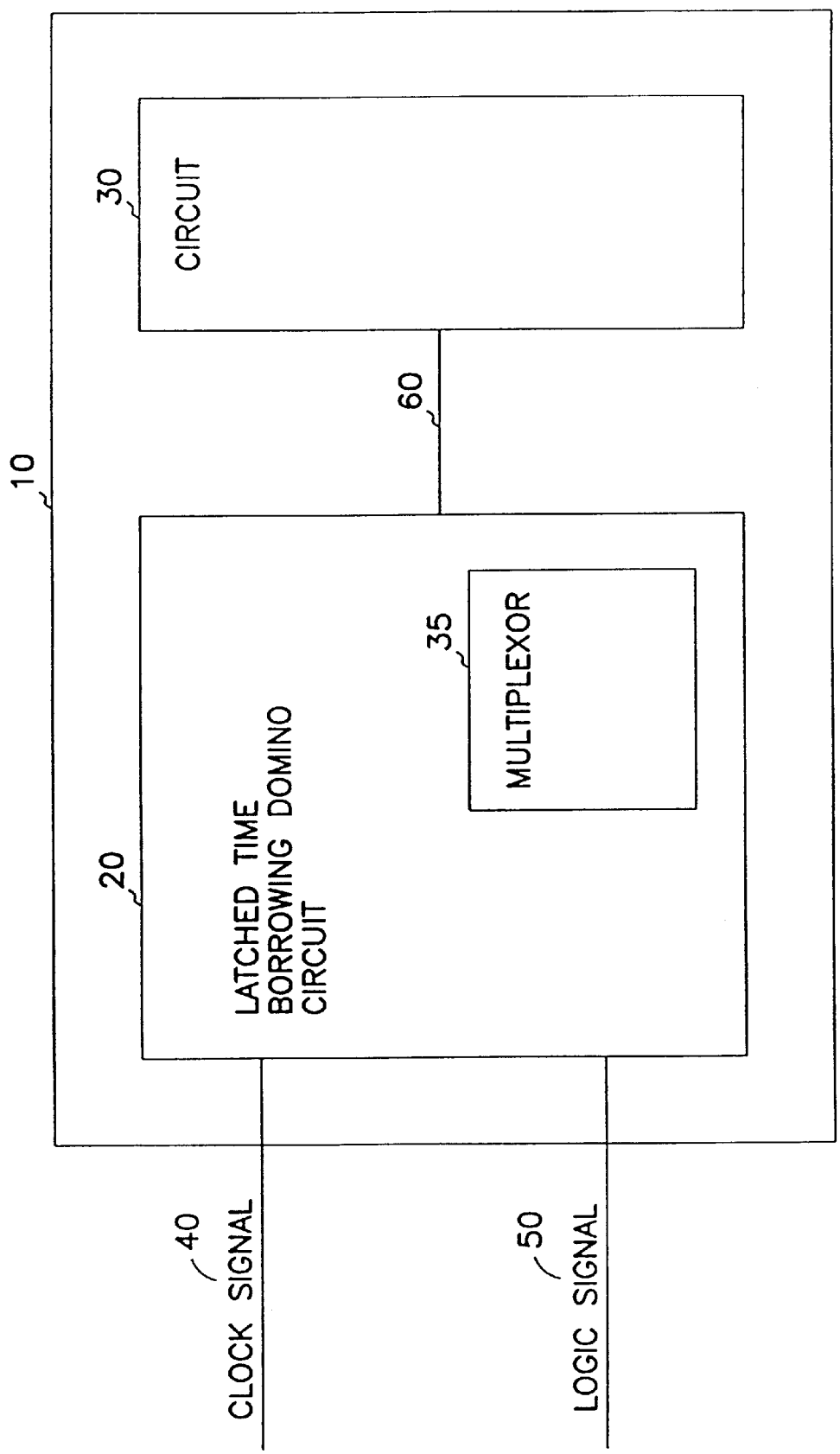
FIG. 1 is a block diagram of a system incorporating the present invention.

Referring to FIG. 1, integrated circuit 10 is shown comprising latched time borrowing domino circuit 20, which is coupled to circuit 30. Domino circuit 20 includes multiplexor 35, and further includes as inputs, clock signal 40, logic signals 50, and provides complementary outputs 60. This embodiment of the present invention is useful when circuit 30 requires access to complementary outputs 60 of domino circuit 20, or circuit 30 requires multiplexed outputs of domino circuit 20. Complementary outputs 60 include an output and an inverted output, which are available concurrently. The present invention provides the additional advantage that input logic signals 50 are transmitted to the output of domino circuit 20 in one-half of a clock cycle. Thus, domino circuit 10 receives clock signal 40 and logic signals 50 as inputs, evaluates logic signals 50, and presents the results at complementary outputs 60 of domino circuit 10 in less than one-half of a clock cycle. At that time, the results are available for processing by circuit 30. Circuit 30 may perform a variety of logic functions. For example, it may perform a logical AND, OR, NAND, NOR, EXCLUSIVE-OR, EXCLUSIVE-NOR or INVERTER function.

Figure 1A:
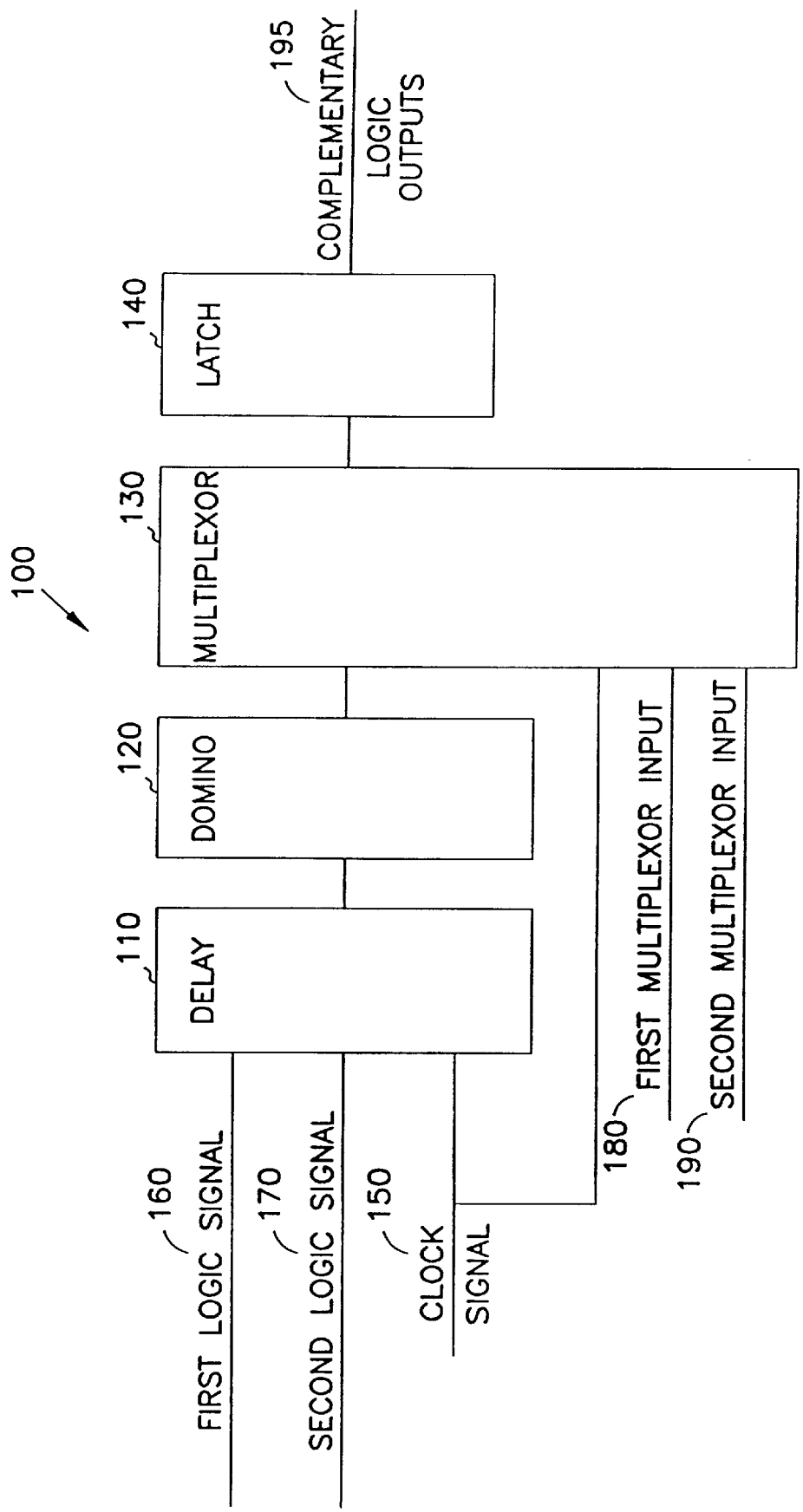
FIG. 1A is a block diagram of the latched time borrowing domino circuit of the present invention.

Referring to FIG. 1A, for one embodiment of the present invention latched time borrowing domino circuit 100 is illustrated. Latched time borrowing domino circuit 100 comprises trailing edge delay circuit 110, domino logic circuit 120, multiplexor 130, and latch 140. Logic signals that drive latched time borrowing domino circuit 100 include clock signal 150 having precharge phase 810 and evaluate phase 820 (shown in FIG. 2A), first logic signal 160, second logic signal 170, first multiplexor signal 180 and second multiplexor signal 190. Logic signals generated by domino circuit 100 include complementary logic outputs 195 including an output and an inverted output available concurrently. Clock signal 150 has a start time, which can occur at either the trailing edge or the leading edge of the clock signal 150. Complementary logic outputs 195, including an output and an inverting output, have a latch time defined as the time after the beginning of a clock cycle when complementary logic outputs 195 are valid. In one embodiment, the latch time occurs between about 0.8 nanoseconds and 1.2 nanoseconds after the start time. In an alternate embodiment, the latch time occurs between about 0.4 nanoseconds and about 0.6 nanoseconds after the start time. An advantage of the present invention is that the latch time is easily reduced without changing the architecture of the logic circuits. As faster switching devices and technologies are developed and embodied in the invention, the latch time is reduced.

Figure 2:
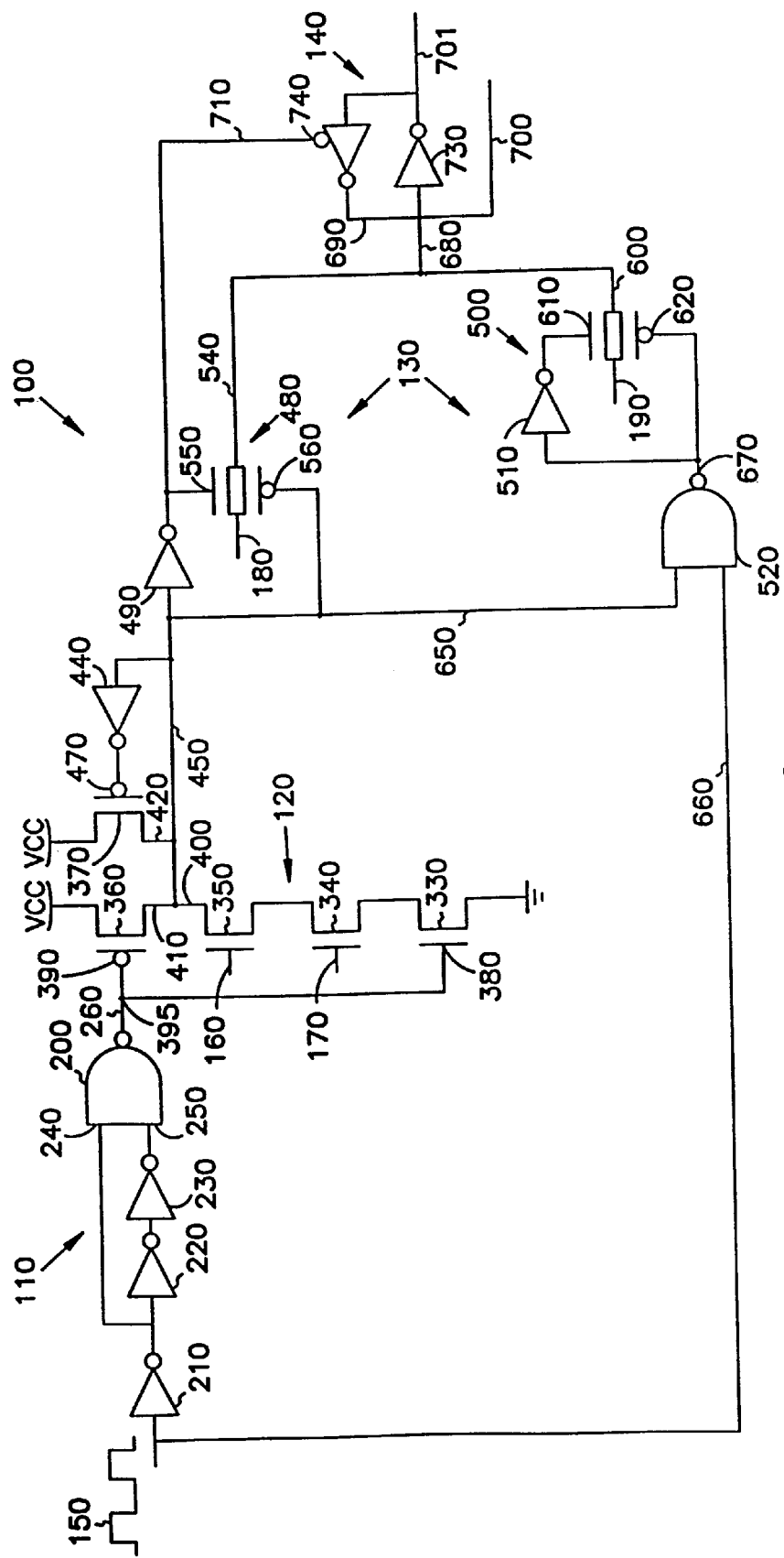
FIG. 2 is a schematic diagram of the time borrowing domino circuit of the present invention.

Referring to FIG. 2, one detailed embodiment of domino circuit 100 is described. Trailing edge delay circuit 110 is provided to delay the trailing edge of clock signal 150. Trailing edge delay circuit 110 comprises NAND gate 200, and inverters 210, 220, and 230. NAND gate 200 comprises NAND inputs 240 and 250, and delayed clock output 260. The input of inverter 210 is coupled to clock signal 150. Three inverters, 210, 220, and 230 are connected in series and coupled to NAND input 250. NAND input 240 is coupled to the output of inverter 210. Trailing edge delay circuit 110 is designed to delay the trailing edge of clock signal 150 by a time of between about ten percent and sixty percent of precharge phase 810 (shown in FIG. 2A). Those skilled in the art will recognize that other electronic delay mechanisms, such as tapped delay lines and trigger circuits, can also effectively function as trailing edge delay circuit 110.

Domino logic circuit 120 is provided to generate a logic output to control multiplexor 130. Domino logic circuit 120 follows trailing edge delay circuit 110 and responds to delayed clock output 260, first logic signal 160, and second logic signal 170. Domino circuits are distinguished by the fact that they are designed to be triggered on a first clock transition and latched by the following clock transition. For one embodiment of the present invention, serially connected transistor 330, transistor 340, and transistor 350 are loaded by the parallel combination of transistor 360 and transistor 370, which combine to perform a logical NAND function. Output 450 responds to the first and second logic signals 160 and 170 according to NAND logic. Transistor 330, transistor 340, and transistor 350 are n-channel complementary metal-oxide semiconductor (CMOS) transistors, while transistor 360 and transistor 370 are p-channel CMOS transistors. Gate 380 of transistor 330 is coupled to gate 390 of transistor 360 and forms the domino clock input 395. Input 395 is coupled to receive delayed clock output 260 from trailing edge delay circuit 110. The coupling of source 400 of transistor 350, drain 410 of transistor 360, and drain 420 of transistor 370 forms domino logic output 450 and is coupled to the input of inverter 440. The output of inverter 440 is coupled to gate 470 of transistor 370. Domino logic circuit 120 of the latched time borrowing domino circuit 100 can be designed to perform any logical function, including but not limited to AND, OR, NAND, NOR, EXCLUSIVE-OR, and EXCLUSIVE-NOR.

Multiplexor 130 is provided for selecting one input from a number of inputs in response to domino logic output 450 and clock signal 150. Multiplexor 130 comprises first pass circuit 480 having first pass inverter 490, and second pass circuit 500 having second pass inverter 510 and second pass NAND gate 520.

First pass multiplexor signal 180 is gated to first data output 540 when first pass plus control 550 and first pass minus control 560 are enabled. Plus control 550 is enabled when the output of first pass inverter 490 is positive, and minus control 560 is enabled when the input to first pass inverter 490 is negative.

Second pass multiplexor signal 190 is gated to second data output 600 when second pass plus control 610 and second pass minus control 620 are enabled. Plus control 610 is enabled when the output of second pass inverter 510 is positive, and minus control 620 is enabled when the input to second pass inverter 510 is negative. The input to second pass inverter 510 is negative when the output of NAND gate 520 is negative, and the output of NAND gate 520 is negative when the multiplexor control input 650 and multiplexor clock input 660 are positive.

In operation, when the control inputs of first pass circuit 480 and second pass circuit 500 are not enabled, first pass data output 540 and second pass data output 600 present a high impedance to latch 140. When the control inputs of first pass circuit 480 are enabled, first multiplexor signal 180 is gated to first data output 540, and when the control inputs of second pass circuit 500 are enabled second pass multiplexor signal 190 is gated to second pass data output 600. During normal operation first pass circuit 480 and second pass circuit 500 are not enabled at the same time.

Latch 140 is provided to latch multiplexor output 680 in response to inverted domino logic output 450. Latch 140 comprises inverter 730 and inverter 740. The output of inverter 730 is coupled to the input of inverter 740, and the output of inverter 740 is coupled to the input of inverter 730. Latch control input 710 is coupled to inverter 740. Latch 140 receives data input from multiplexor output 680, and generates complementary logic outputs 700 and 701.

In operation, latch 140 receives data from multiplexor output 680 at the input of inverter 730. This data is inverted and propagates to second inverter 740. When latch control input 710 assumes a zero logic level, the data at inverter 740 is inverted and propagates to the input of inverter 730. At this time, the data initially at the input of inverter 730 is latched.

Latched time borrowing domino circuit 100 has four external data signal inputs—first logic signal 160, second logic signal 170, first multiplexor signal 180, and second multiplexor signal 190. First logic signal 160 and second logic signal 170 are inputs to domino logic circuit 120, which for one embodiment is a NAND gate, and are used to generate domino logic output 450, while first multiplexor signal 180 and second multiplexor signal 190 are the signals gated to latch 140, in response to domino logic output 450 and clock signal 150. First logic signal 160, second logic signal 170, first multiplexor signal 180, and second multiplexor signal 190 are logic signals that also take on the logical values of zero and one.

Figure 2A:
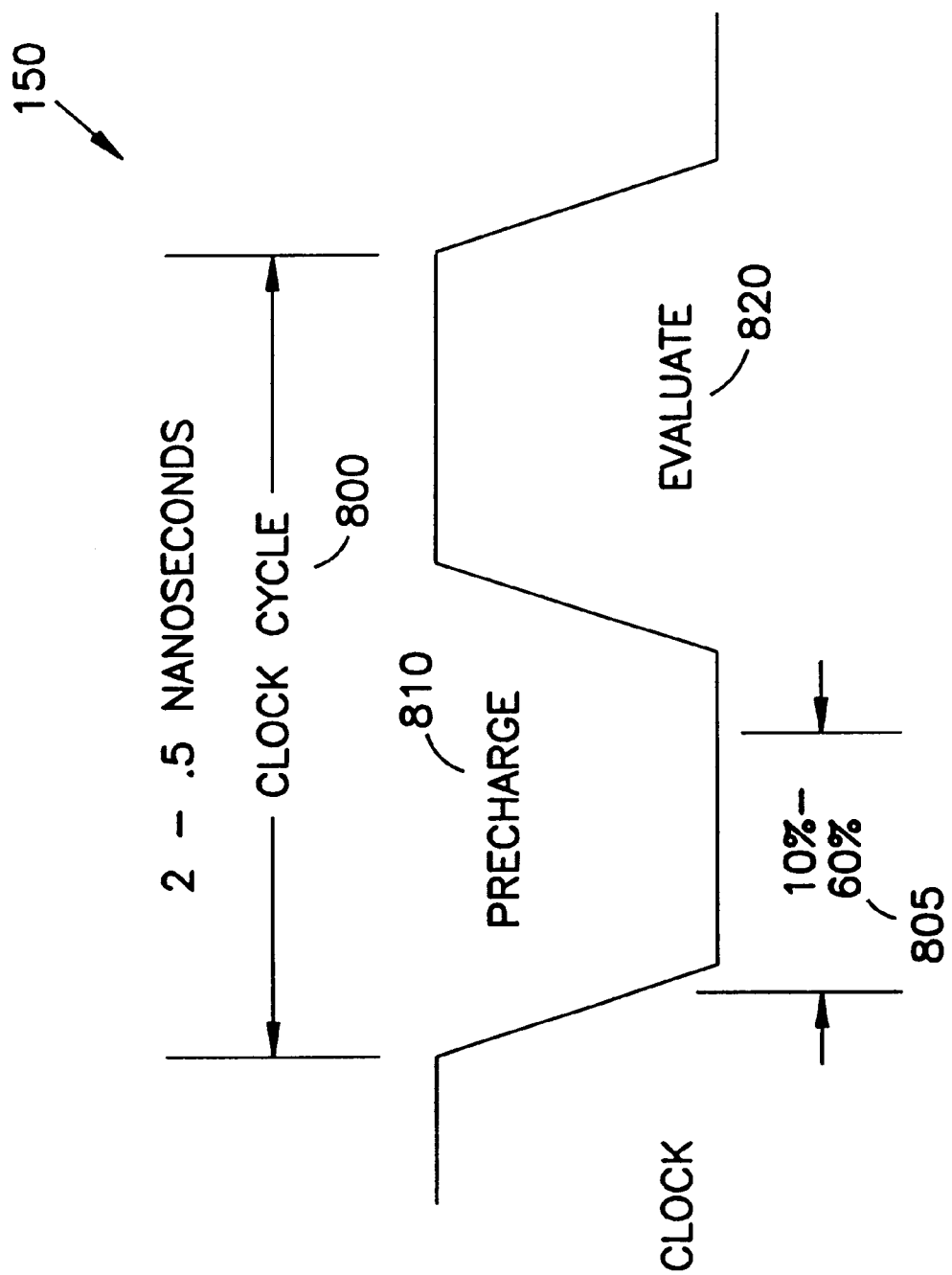
FIG. 2A is a diagram of the clock signal of the present invention.

Referring to FIG. 2A, clock signal 150 is a periodic logic signal taking on the logic values of zero and one, having a frequency of about 500 MHZ, corresponding to clock period or clock cycle 800 of two nanoseconds, and a duty cycle of about fifty percent, but the operation of the present invention can be extended above two gigahertz. For example, by slightly decreasing the switching times of the switching devices, such as transistors described below, the present invention is capable of operating with clock signal 150 having a frequency of between about 1.5 gigahertz and 2.5 gigahertz. With a slightly greater decrease in the switching times of the switching devices, the present invention is capable of operating with clock signal 150 having a frequency of between about 2.0 gigahertz and about 4.0 gigahertz.

Referring to FIG. 2 and FIG. 2A, clock signal 150 is provided as an input to latched time borrowing domino circuit 100. The purpose of clock signal 150 is to coordinate the operation of domino logic circuit 120. Clock signal 150 has two phases, a precharge phase 810, or logical zero phase, and an evaluate phase 820, or logical one phase. Clock signal 150 is delayed by trailing edge delay circuit 110, and the delay is between ten and sixty percent 805 of precharge phase 810 as shown in FIG. 2A. Latched time borrowing domino circuit 100 is best understood by analyzing its operation during precharge phase 810 and then analyzing its operation during evaluate phase 820.

During precharge phase 810, the logical value of clock signal 150 is zero. Since transistor 330 is gated off and transistor 360 is gated on, domino logic output 450 is one. Then, first pass circuit 480 and second pass circuit 500 are gated off, so multiplexor output 680 assumes a high impedance state, and latch output 700 is unchanged from its value prior to precharge phase 810.

During the evaluate phase 820, the logical value of the clock signal 150 is one, which forces the delayed clock output 260 of the trailing edge delay circuit 110 to a logical one. Since the delayed clock output 260 is coupled to the domino clock input 395, the domino clock input 395 is a logical one, which forces transistor 330 on and transistor 360 off. The value of the domino logic output 450 is then determined by the values of the first logic signal 160 and the second logic signal 170. There are two cases to consider.

During evaluate phase 820, the logical value of clock signal 150 is one and in the first case when either first logic signal 160 or second logic signal 170 is a logical zero, domino logic output 450 is one, first pass circuit 480 is gated off, second pass circuit 500 is gated on, and second multiplexor signal 190 is latched at latch output 700 at the end of evaluate phase 820.

During evaluate phase 820, the logical value of clock signal 150 is one, and in the second case, when first logical signal 160 is a logical one and second logical signal 170 is a logical one, domino logic output 450 is zero, first pass circuit 480 is gated on, second pass circuit 500 is gated off, and first multiplexor signal 180 is latched at latch output 700 at the end of evaluate phase 820.

Latched time borrowing domino circuit 100 of FIG. 2 is capable of performing a logical NAND function or performing a multiplexor selection function. To configure latched time borrowing domino circuit 100 to perform a logical NAND function, first multiplexor signal 180 is set to a logical zero, and second multiplexor signal 190 is set to a logical one. When performing a multiplexor selection function, first multiplexor signal 180 is selected when first logic signal 160 is a logical one and second logic signal 170 is a logic one, and second multiplexor signal 190 is selected when either first logic signal 160 or second logic signal 170 is a logical zero.

In either mode of operation, whether latched time borrowing domino circuit 100 is performing a logical operation such as a NAND function or performing a multiplexor gating function, the setup time is maximized in time borrowing domino circuit 100 by gating latch 140 on the trailing edge of delayed clock output 260, and the delay time is minimized by presetting first multiplexor signal 180 and second multiplexor signal 190 and only requiring trailing edge delayed clock output 260 to set the selected output of multiplexor 130 into latch 140.

Figure 3:
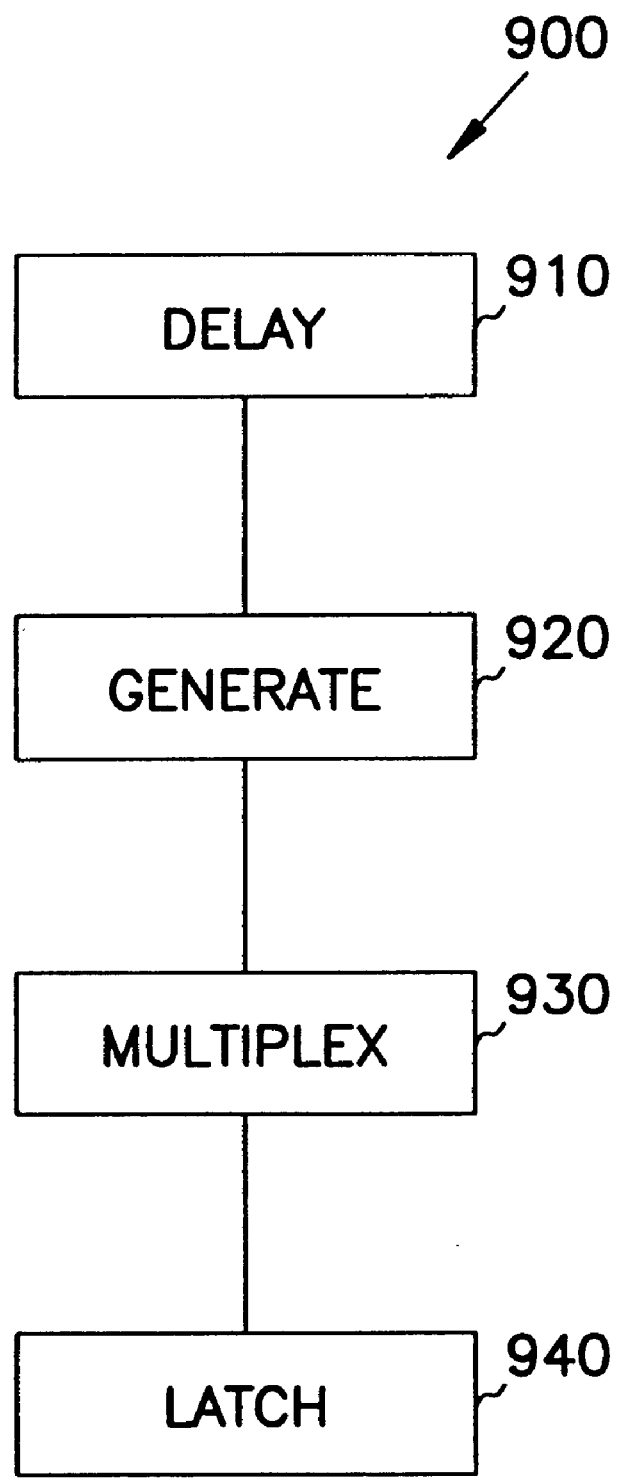
FIG. 3 is a general flow diagram of a method of the present invention.

Referring to FIG. 3, method 900, one embodiment of the present invention, is shown. The method comprises delaying 910, generating 920, multiplexing 930, and latching 940. Delaying 910 requires delaying a clock signal to generate a delayed clock signal. The delayed clock signal is typically four gate delays. Generating 920 requires generating a domino logic output from a plurality of domino logic signals and a delayed clock signal. The logical function generated by the domino circuit may be an AND, OR, NAND, NOR, or EXCLUSIVE-OR. Multiplexing 930 requires multiplexing a plurality of logic signals based on the value of the domino logic output and the delayed clock signal to create a multiplexed logic output signal. Latching 940 requires latching the multiplexed output signal. The latch is typically a two inverter latch having a control input.

A latched time borrowing domino circuit and method have been described which provide a complementary output and a multiplexed output without adding an extra logic gate delay to the domino circuit. Therefore, a output, such as the multiplexed output, and an inverted output, such as the complementary output, are available concurrently in one embodiment of the latched time borrowing domino circuit. To generate a delayed clock signal, a trailing edge delay circuit has been described. The delay has been described as being between ten percent and sixty percent of the precharge phase. A domino logic circuit has been described which can operate as an AND, OR, NOR, NAND, EXCLUSIVE-OR, or EXCLUSIVE-NOR. A multiplexor has been described as having two logical inputs. The logical inputs can be gated individually, and may simulate a logical function such as AND, OR, NAND, NOR, EXCLUSIVE-OR, or EXCLUSIVE-NOR. The multiplexor has also been described as not increasing the propagation delay of the time borrowing domino circuit. A latch has been described as latching the output of the multiplexor during the precharge phase when the output of the multiplexor is not in a high impedance state. The latch has also been described as having complementary outputs, and not increasing the propagation delay of the time borrowing domino circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   a latched time borrowing domino circuit having a first input to receive a clock signal and a second input to receive a logic signal, the latched time borrowing domino circuit is capable of providing a multiplexor function, and concurrently providing an output, and an inverted output; and
   a circuit coupled to the latched time borrowing domino circuit.

2. The latched time borrowing domino circuit of claim 1, wherein the domino logic circuit is fabricated using a complementary metal oxide semiconductor process.

3. The latched time borrowing domino circuit of claim 2, wherein the clock signal has a frequency of between about 1.5 gigahertz and about 2.5 gigahertz.

4. The latched time borrowing domino circuit of claim 2 wherein the clock signal has a frequency of between about 2.0 gigahertz and about 4.0 gigahertz.

5. A latched time borrowing domino circuit comprising:
   a trailing edge delay circuit, the circuit having a clock input and a delayed clock output, the clock input is coupled to receive a clock signal having a precharge phase and an evaluate phase;
   a domino logic circuit having a domino clock input coupled to the delayed clock output, a plurality of domino logic inputs, and a domino logic output;
   a multiplexor having a multiplexor clock input, a plurality of multiplexor data inputs, a multiplexor output, a multiplexor control input, and a multiplexor control output, the multiplexor clock input is coupled to receive the clock signal, the multiplexor control input is coupled to the domino logic output; and
   a latch for latching the multiplexor output, the latch having a latch input, a latch output, a complementary latch output, and a latch control input, the latch input is coupled to the multiplexor output, the latch control input is coupled to the multiplexor control output, and the latch output and the complementary latch output are available concurrently.

6. The latched time borrowing domino circuit of claim 5, wherein the trailing edge delay circuit delays the trailing edge of the clock signal by between about ten percent and sixty percent of the precharge phase.

7. The latched time borrowing domino circuit of claim 5, wherein the domino logic circuit comprises a two input NAND gate.

8. The latched time borrowing domino circuit of claim 5, wherein the domino logic circuit comprises a logical NAND function.

9. The latched time borrowing domino circuit of claim 5, wherein the domino logic circuit comprises a logical NOR function.

10. The latched time borrowing domino circuit of claim 5, wherein the domino logic circuit comprises a logical OR function.

11. The latched time borrowing domino circuit of claim 5, wherein the domino logic circuit comprises a logical AND function.

12. The latched time borrowing domino circuit of claim 5, wherein the domino logic circuit comprises a logical EXCLUSIVE-OR function.

13. The latched time borrowing domino circuit of claim 5, wherein the domino logic circuit comprises a logical EXCLUSIVE-NOR function.

14. The latched time borrowing domino circuit of claim 5, wherein the plurality of domino logic inputs are received from a latched time borrowing domino circuit.

15. The latched time borrowing domino circuit of claim 5, wherein the multiplexor comprises of a plurality of pass circuits.

16. The latched time borrowing domino circuit of claim 5, wherein the latch for latching the multiplexor output comprises a two inverter latch.

17. The latched time borrowing domino circuit of claim 5, wherein the domino logic circuit is fabricated using a complementary metal oxide semiconductor process.

18. A method for generating a logic output signal in a latched time borrowing domino circuit driven by a clock signal having a start time comprising:

delaying the clock signal to generate a delayed clock signal;

generating a domino logic output from a plurality of domino logic signals and the delayed clock signal;

multiplexing a plurality of logic signals based on the value of the domino logic output and the delayed clock signal to create a multiplexed logic output signal; and latching the multiplexed output signal at a latch time.

19. The method of claim 18, wherein delaying the clock signal to generate a delayed clock signal comprises:

delaying the clock signal by about four gate delays to generate the delayed clock signal.

20. The method of claim 18, wherein latching the multiplexed output signal at a latch time comprises:

latching the multiplexed output signal at the latch time of between about 0.8 nanoseconds and about 1.2 nanoseconds after the start time.

21. The method of claim 18, wherein latching the multiplexed output signal at a latch time comprises:

latching the multiplexed output signal at the latch time of between about 0.4 nanoseconds and about 0.6 nanoseconds after the start time.

22. A latched time borrowing domino circuit comprising:

a clock signal input for receiving a clock signal;

a trailing edge delay circuit that delays the trailing edge of the clock signal by four gate delays;

a complementary metal-oxide semiconductor (CMOS) domino NAND circuit coupled to the trailing edge delay circuit;

a multiplexor coupled to the clock signal and the CMOS domino NAND circuit; and a latch comprising two serially connected inverters having a control input, the latch is coupled to the multiplexor and an inverted output of the domino NAND circuit.

* * * * *